(12) United States Patent
Ikeda

(10) Patent No.: US 10,886,836 B2
(45) Date of Patent: Jan. 5, 2021

(54) SEMICONDUCTOR DEVICE, POWER CONVERSION DEVICE, DRIVING DEVICE, VEHICLE, AND ELEVATOR

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 311 days.

(21) Appl. No.: 16/120,994

(22) Filed: Sep. 4, 2018

(65) Prior Publication Data

US 2019/0296636 A1 Sep. 26, 2019

(30) Foreign Application Priority Data

Mar. 21, 2018 (JP) .................................. 2018-053638

(51) Int. Cl.
*H02M 1/32* (2007.01)
*H02H 9/04* (2006.01)
(Continued)

(52) U.S. Cl.
CPC ........ *H02M 1/32* (2013.01); *G01R 19/16576* (2013.01); *G01R 31/002* (2013.01);
(Continued)

(58) Field of Classification Search
CPC ...... H02M 1/32; G01R 19/16576; H02H 9/04
See application file for complete search history.

(56) References Cited

U.S. PATENT DOCUMENTS 7,242,238 B2 7/2007 Higashi
9,118,260 B2 * 8/2015 Gautier ............ H02M 7/53871
(Continued)

FOREIGN PATENT DOCUMENTS

JP 2005-269446 9/2005
JP 2008-67593 3/2008
(Continued)

OTHER PUBLICATIONS

U.S. Appl. No. 15/896,563, filed Feb. 14, 2018, Kentaro Ikeda.
(Continued)

*Primary Examiner* — Scott Bauer
(74) *Attorney, Agent, or Firm* — Oblon, McClelland, Maier & Neustadt, L.L.P.

(57) ABSTRACT

Provided is a semiconductor device including: a semiconductor element having a first electrode, a second electrode, and a gate electrode; a surge voltage measuring unit electrically connected to the first electrode or the second electrode to measure a surge voltage; at least one measuring unit selected from a first measuring unit measuring electromagnetic noise caused by an operation of the semiconductor element, a second measuring unit measuring a voltage of a wiring electrically connected to the first electrode or the second electrode, and a third measuring unit measuring a current of the wiring electrically connected to the first electrode or the second electrode; a variable resistor electrically connected to the gate electrode; and a controller controlling the variable resistor based on measurement results of the surge voltage measuring unit and the at least one measuring unit and change a resistance value of the variable resistor.

12 Claims, 12 Drawing Sheets

(51) Int. Cl.
  *H02H 1/00* (2006.01)
  *H02M 7/5387* (2007.01)
  *G01R 31/00* (2006.01)
  *G01R 19/165* (2006.01)
  *H02P 27/06* (2006.01)
  *H01L 29/16* (2006.01)
  *H01L 29/20* (2006.01)

(52) U.S. Cl.
  CPC ............ *H02H 1/0007* (2013.01); *H02H 9/04* (2013.01); *H02M 7/5387* (2013.01); *H01L 29/1608* (2013.01); *H01L 29/2003* (2013.01); *H02P 27/06* (2013.01)

(56) References Cited

U.S. PATENT DOCUMENTS

| | | | |
|---|---|---|---|
| 9,548,729 B2* | 1/2017 | Miyamae | H03K 17/16 |
| 10,491,095 B2* | 11/2019 | Chen | B60L 50/66 |
| 10,622,988 B2* | 4/2020 | Sasaki | H03K 17/567 |
| 2005/0128671 A1* | 6/2005 | Miyamoto | H02M 7/538 |
| | | | 361/118 |
| 2005/0146295 A1* | 7/2005 | Miyamoto | H03K 17/0406 |
| | | | 318/105 |
| 2018/0375423 A1 | 12/2018 | Ikeda | |
| 2019/0140536 A1 | 5/2019 | Ikeda | |
| 2019/0260369 A1* | 8/2019 | Iwata | H03K 17/0822 |
| 2019/0296634 A1 | 9/2019 | Ikeda | |

FOREIGN PATENT DOCUMENTS

| | | |
|---|---|---|
| JP | 2010-17042 | 1/2010 |
| JP | 2017-118792 | 6/2017 |
| JP | 2019-9914 A | 1/2019 |
| JP | 2019-33556 A | 2/2019 |
| JP | 2019-88095 A | 6/2019 |
| JP | 2019-170035 A | 10/2019 |

OTHER PUBLICATIONS

U.S. Appl. No. 15/889,414, filed Feb. 6, 2018, Kentaro Ikeda.
U.S. Appl. No. 16/111,446, filed Aug. 24, 2018, Kentaro Ikeda.
Lobsiger, Y. et al., "Closed-Loop IGBT Gate Drive Featuring Highly Dynamic di/dt and dv/dt Control", IEEE, 2012, pp. 8.

* cited by examiner

SEMICONDUCTOR DEVICE, POWER CONVERSION DEVICE, DRIVING DEVICE, VEHICLE, AND ELEVATOR

CROSS-REFERENCE TO RELATED APPLICATION

This application is based upon and claims the benefit of priority from Japanese Patent Application No. 2018-053638, filed on Mar. 21, 2018, the entire contents of which are incorporated herein by reference.

FIELD

Embodiments described herein relate generally to a semiconductor device, a power conversion device, a driving device, a vehicle, and an elevator.

BACKGROUND

A surge voltage may be generated due to an inductance of a circuit when, for example, a power transistor performing a switching operation at high speed is turned off. If the surge voltage is generated, there is a problem in that breakdown of a gate insulating film may occur or ringing of the circuit may occur.

By increasing a resistance of a gate connected to a gate electrode of the power transistor, a switching speed is decreased at the time of switching. It is possible to suppress the surge voltage by decreasing the switching speed. However, the decrease in the switching speed is not preferable because a switching loss is increased.

DETAILED DESCRIPTION

Figure 1:
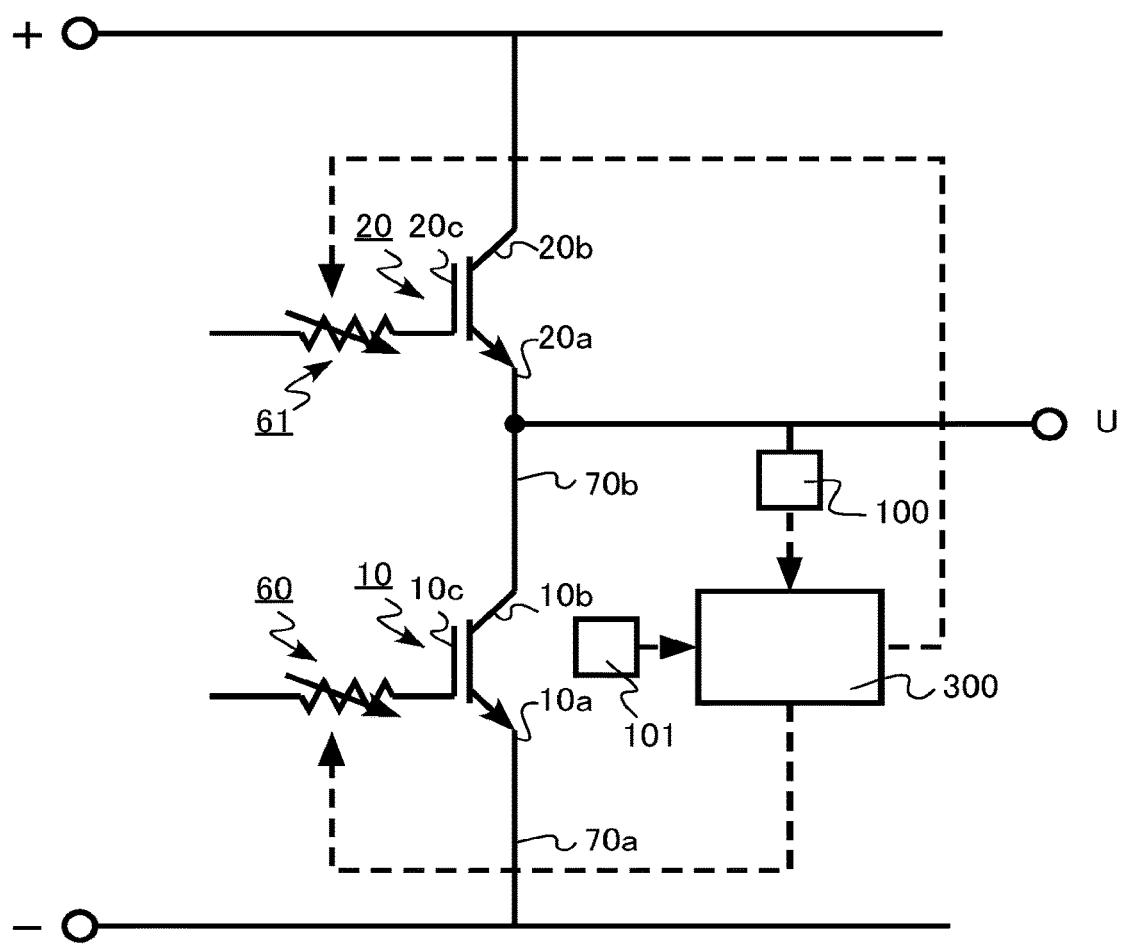
FIG. 1 is a schematic diagram of a semiconductor device according to a first embodiment.

A semiconductor device of an embodiment includes: a semiconductor element having a first electrode, a second electrode, and a gate electrode; a surge voltage measuring unit electrically connected to the first electrode or the second electrode, the surge voltage measuring unit being configured to measure a surge voltage; at least one measuring unit selected from a first measuring unit configured to measure electromagnetic noise caused by an operation of the semiconductor element, a second measuring unit configured to measure a voltage of a wiring electrically connected to the first electrode or the second electrode, and a third measuring unit configured to measure a current of the wiring electrically connected to the first electrode or the second electrode; a variable resistor electrically connected to the gate electrode; and a controller configured to control the variable resistor based on first measurement result of the surge voltage measuring unit and second measurement result of the at least one measuring unit and change a resistance value of the variable resistor.

Hereinafter, embodiments of the present disclosure will be described with reference to the drawings. In the following description, the same or similar members or the like are denoted by the same reference numerals, and a description of members and the like which have been described is omitted as appropriate.

In addition, in the present specification, the semiconductor device is a concept including an integrated circuit (IC) in which a plurality of elements are integrated into one chip, an electronic circuit board on which a plurality of electronic components are disposed, or a power module in which a plurality of elements such as a discrete semiconductor are combined.

In the present specification, a "voltage" means a potential difference with ground potential unless otherwise defined.

First Embodiment

A semiconductor device of a first embodiment includes: a semiconductor element having a first electrode, a second electrode, and a gate electrode; a surge voltage measuring unit electrically connected to any one of the first electrode and the second electrode, the surge voltage measuring unit being configured to measure a surge voltage; at least one measuring unit selected from a first measuring unit configured to measure electromagnetic noise caused by an operation of the semiconductor element, a second measuring unit configured to measure a voltage of a wiring electrically connected to the first electrode or the second electrode, and a third measuring unit configured to measure a current of the wiring electrically connected to the first electrode or the second electrode; a variable resistor electrically connected to the gate electrode; and a controller configured to control the variable resistor based on measurement results of the surge voltage measuring unit and the at least one measuring unit and changes a resistance value of the variable resistor.

The power conversion device of the first embodiment includes the semiconductor device. The semiconductor element of the first embodiment is a transistor.

Figure 2:
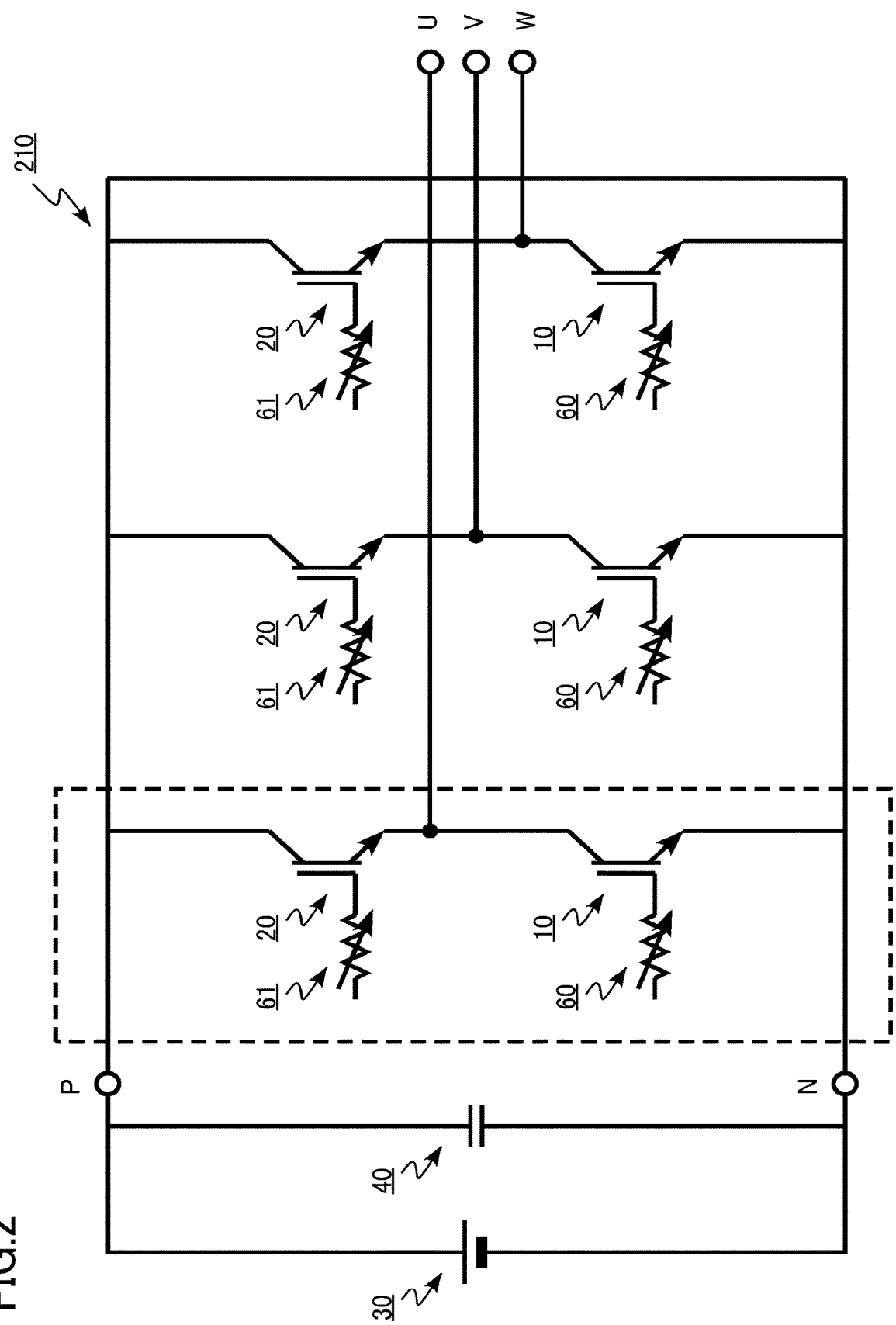
FIG. 2 is a circuit diagram of a power conversion device according to the first embodiment.

FIG. 1 is a schematic diagram of the semiconductor device of the first embodiment. FIG. 2 is a circuit diagram of the power conversion device of the first embodiment. The power conversion device of the first embodiment is an inverter circuit 210. FIG. 1 is a schematic diagram showing details of a part of the inverter circuit 210 of FIG. 2.

The inverter circuit 210 of the first embodiment achieves a so-called active gate control dynamically controlling an operation of a gate of a power transistor.

The inverter circuit 210 shown in FIG. 2 includes three sets of a low side transistor 10 (semiconductor element) and a high side transistor 20. The inverter circuit shown in FIG. 2 includes a positive terminal P, a negative terminal N, an output terminal U, an output terminal V, an output terminal W, a first variable resistor 60, and a second variable resistor 61.

The positive terminal P is connected to a positive electrode of a direct current (DC) power supply 30, and the negative terminal N is connected to a negative electrode of the DC power supply 30. For example, a smoothing capacitor 40 is provided in parallel with the DC power supply 30 between the positive terminal P and the negative terminal N. The inverter circuit is a three-phase inverter.

The voltage of the DC power supply 30 is, for example, 200 V or more and 1500 V or less.

FIG. 1 is a schematic diagram showing details of a region including one set of the low side transistor 10 (semiconductor element) and the high side transistor 20 in the inverter circuit of FIG. 2. FIG. 1 is a schematic diagram of a region surrounded by a dotted line in FIG. 2.

The semiconductor device of the first embodiment includes the low side transistor 10 (semiconductor element), the high side transistor 20, a surge voltage measuring unit 100, a first measuring unit 101, a controller 300, the first variable resistor 60, the second variable resistor 61, a wiring 70a, and a wiring 70b.

The low side transistor 10 and the high side transistor 20 are connected in series. The low side transistor 10 has an emitter electrode 10a (first electrode), a collector electrode 10b (second electrode), and a gate electrode 10c (gate electrode). The high side transistor 20 has an emitter electrode 20a, a collector electrode 20b, and a gate electrode 20c.

The low side transistor 10 and the high side transistor 20 are, for example, an insulated gate bipolar transistor (IGBT). For example, a freewheel diode (not shown) is connected to the low side transistor 10 and the high side transistor 20.

The first variable resistor 60 is connected to the gate electrode 10c of the low side transistor 10. The second variable resistor 61 is electrically connected to the gate electrode 20c of the high side transistor 20.

A gate resistance of the low side transistor 10 can be changed by the first variable resistor 60. A resistance value of an electric resistance connected to the gate electrode 10c can be changed by the first variable resistor 60. A charging and discharging current of a gate of the low side transistor 10 can be changed by the first variable resistor 60.

A gate resistance of the high side transistor 20 can be changed by the second variable resistor 61. A resistance value of an electric resistance connected to the gate electrode 20c can be changed by the second variable resistor 61. A charging and discharging current of a gate of the high side transistor 20 can be changed by the second variable resistor 61.

The configurations of the first variable resistor 60 and the second variable resistor 61 are not limited as long as the resistance is variable. For example, the first variable resistor 60 and the second variable resistor 61 are MOSFETs operating in an analog manner. In addition, for example, the first variable resistor 60 and the second variable resistor 61 are a plurality of MOSFETs that are connected in parallel. The resistance value is changed by switching the number of MOSFETs that are in an ON state and an OFF state.

The surge voltage measuring unit 100 is electrically connected to the collector electrode 10b. The surge voltage measuring unit 100 has a function of measuring the surge voltage generated between the low side transistor 10 and the high side transistor 20. The surge voltage measuring unit 100 directly measures the surge voltage generated at the collector electrode 10b.

The surge voltage measuring unit 100 is, for example, an electronic circuit. The surge voltage measuring unit 100 is, for example, an IC in which a plurality of elements are integrated into one chip or an electronic circuit board on which a plurality of electronic components are disposed. The configuration of the surge voltage measuring unit 100 is not limited as long as the surge voltage measuring unit 100 can measure the surge voltage. For example, it is also possible to apply an oscilloscope to the surge voltage measuring unit 100.

The first measuring unit 101 has a function of measuring electromagnetic noise caused by the operation of the transistor. The first measuring unit 101 is, for example, an electromagnetic noise sensor.

The configuration of the first measuring unit 101 is not limited as long as the first measuring unit 101 can measure the electromagnetic noise. For example, the first measuring unit 101 is an electronic circuit having a loop antenna formed by using a line on a circuit board. For example, the first measuring unit 101 is a measuring instrument having a probe with a built-in loop antenna.

The controller 300 has a function of controlling the first variable resistor 60 and the second variable resistor 61 based on the measurement result of the surge voltage measuring unit 100 and the measurement result of the first measuring unit 101. The controller 300 has a function of changing the resistance values of the first variable resistor 60 and the second variable resistor 61. For simplicity of explanation, the control of the first variable resistor 60 will be described below by way of example.

The controller 300 feeds back the measurement result of the surge voltage measuring unit 100 and the measurement result of the first measuring unit 101 to the resistance value of the first variable resistor 60.

The controller 300 is, for example, a microcomputer. The controller 300 is not necessarily limited to the microcomputer. Any configuration may be employed as long as the function of controlling the first variable resistor 60 based on the measurement result of the surge voltage measuring unit 100 and the measurement result of the first measuring unit 101 can be achieved. For example, it is also possible to apply a logic circuit or an analog circuit other than the microcomputer to the controller 300.

For example, when the surge voltage measured by the surge voltage measuring unit 100 deviates from a target value, the controller 300 controls the first variable resistor 60 to change the resistance value of the first variable resistor 60. The controller 300 changes the resistance value of the first variable resistor 60 so that the surge voltage approaches the target value. For example, when the surge voltage measured by the surge voltage measuring unit 100 exceeds the target value, the controller 300 increases the resistance value of the first variable resistor 60.

Further, for example, when the electromagnetic noise measured by the first measuring unit 101 deviates from the target value, the controller 300 controls the first variable resistor 60 to change the resistance value of the first variable resistor 60. The controller 300 changes the resistance value of the first variable resistor 60 so that the electromagnetic noise approaches the target value. For example, when the electromagnetic noise measured by the first measuring unit 101 exceeds the target value, the controller 300 controls the first variable resistor 60 to increase the resistance value of the first variable resistor 60.

The controller 300 has, for example, a function of calculating a first lower limit value of the resistance value of the first variable resistor 60 from the surge voltage measured by the surge voltage measuring unit 100. Further, the controller 300 has, for example, a function of calculating a second lower limit value of the resistance value of the first variable resistor 60 from the electromagnetic noise measured by the first measuring unit 101. Then, the surge voltage measuring unit 100 compares the first lower limit value with the second lower limit value to control the resistance value of the first variable resistor 60 to be equal to or higher than the resistance value of the higher one of the first lower limit value and the second lower limit value.

Next, functions and effects of the semiconductor device and the power conversion device of the first embodiment will be described.

The surge voltage may be generated due to the inductance of the circuit, for example, when a power transistor performing the switching operation at high speed is turned off. If the surge voltage is generated, there is a problem in that the breakdown of the gate insulating film may occur or the ringing of the circuit may occur.

By increasing the resistance of the gate connected to the gate electrode of the power transistor, the switching speed is decreased at the time of the switching, and the surge voltage can be suppressed. However, the decrease in the switching speed is not preferable because the switching loss of the power transistor is increased.

In addition, the power transistor performing the switching operation at high speed causes the electromagnetic noise due to the high-speed circuit operation. If the electromagnetic noise occurs, for example, malfunction may occur in electronic devices around the power transistor. There is a problem in that the electromagnetic noise causes so-called electromagnetic interference (EMI).

By increasing the resistance of the gate connected to the gate electrode of the power transistor, the switching speed is decreased at the time of the switching to be able to suppress the electromagnetic noise. However, the decrease in the switching speed is not preferable because the switching loss of the power transistor is increased.

The surge voltage and the electromagnetic noise depend on various parameters such as the circuit configurations and operation conditions of the semiconductor device or the power conversion device and the configurations or operation conditions of loads connected to the semiconductor device or the power conversion device. For this reason, a large number of processes are required to determine an appropriate gate resistance value at the design stage of the semiconductor device or the power conversion device. In addition, even if a large number of processes are used, it is extremely difficult to determine an optimum gate resistance value.

Therefore, the gate resistance value is inevitably set to have a large margin. Therefore, the switching speed of the power transistor is unnecessarily decreased, and the switching loss of the power transistor may be increased.

The semiconductor device and the power conversion device of the first embodiment include the surge voltage measuring unit 100. The surge voltage measuring unit 100 directly measures the surge voltage generated between the low side transistor 10 and the high side transistor 20 during the operation of the inverter circuit.

Based on the measurement result measured by the surge voltage measuring unit 100, the controller 300 controls the first variable resistor 60. The controller 300 changes the resistance value of the first variable resistor 60 so that the resistance value of the first variable resistor 60 is an appropriate resistance value during the operation of the inverter circuit. A so-called active gate control is executed.

For example, when the surge voltage measured by the surge voltage measuring unit 100 deviates from the target value, the controller 300 controls the first variable resistor 60 to change the resistance value of the first variable resistor 60. The controller 300 changes the resistance value of the first variable resistor 60 so that the surge voltage approaches the target value.

For example, when the surge voltage measured by the surge voltage measuring unit 100 exceeds the target value, the controller 300 controls the first variable resistor 60 to increase the resistance value of the first variable resistor 60. By increasing the resistance value of the first variable resistor 60, the gate resistance of the low side transistor 10 is increased, the switching speed is decreased, and the generation of the surge voltage is suppressed. In other words, the charging/discharging current of the gate of the low side transistor 10 is decreased, and the generation of the surge voltage is suppressed.

The appropriate resistance value is, for example, a lower limit value for preventing the generation of the surge voltage. By setting the resistance value of the first variable resistor 60 to the lower limit value, the switching speed of the low side transistor 10 is suppressed from unnecessarily decreasing, and the switching loss is suppressed.

In addition, the semiconductor device and the power conversion device of the first embodiment include the first measuring unit 101. During the operation of the inverter circuit, the first measuring unit 101 measures the electromagnetic noise occurring in the wiring 70b electrically connected to the collector electrode 10b.

Based on the measurement result measured by the first measuring unit 101, the controller 300 controls the first variable resistor 60. The controller 300 changes the resistance value of the first variable resistor 60 so that the resistance value of the first variable resistor 60 is the appropriate resistance value during the operation of the inverter circuit.

Further, for example, when the electromagnetic noise measured by the first measuring unit 101 deviates from the target value, the controller 300 controls the first variable resistor 60 to change the resistance value of the first variable resistor 60. The controller 300 changes the resistance value of the first variable resistor 60 so that the electromagnetic noise approaches the target value.

For example, when the electromagnetic noise measured by the first measuring unit 101 exceeds the target value, the controller 300 controls the first variable resistor 60 to increase the resistance value of the first variable resistor 60. By increasing the resistance value of the first variable resistor 60, the gate resistance of the low side transistor 10 is increased, the switching speed is decreased, and the generation of the surge voltage is suppressed.

The appropriate resistance value is, for example, the lower limit value for preventing the generation of the electromagnetic noise. By setting the resistance value of the first variable resistor 60 to the lower limit value, the switching speed of the low side transistor 10 is suppressed from unnecessarily decreasing, and the switching loss is suppressed.

For example, the surge voltage measuring unit 100 calculates a first lower limit value of the resistance value of the first variable resistor 60 from the surge voltage measured by the surge voltage measuring unit 100. Further, the surge voltage measuring unit 100 calculates a second lower limit value of the resistance value of the first variable resistor 60 from the electromagnetic noise measured by the first measuring unit 101. Then, the surge voltage measuring unit 100 compares the first lower limit value with the second lower limit value to control the resistance value of the first variable resistor 60 to be equal to or higher than the resistance value of the higher one of the first lower limit value and the second lower limit value.

By setting the resistance value of the first variable resistor 60 to be equal to or higher than the resistance value of the higher one of the first lower limit value and the second lower limit value, the suppression of the generation of the surge voltage and the suppression of the occurrence of electromagnetic noise can be compatible.

According to the semiconductor device and the power conversion device of the first embodiment, the measurement result of the surge voltage measuring unit 100 and the measurement result of the first measuring unit 101 are fed back to the resistance value of the first variable resistor 60. With this feedback, the suppression of the generation of the surge voltage and the suppression of the occurrence of the electromagnetic noise can be compatible.

Furthermore, it is always possible to set the resistance value of the first variable resistor 60 to the minimum resistance value necessary for both suppressing the generation of the surge voltage and suppressing the occurrence of the electromagnetic noise. Therefore, the switching speed can be maximized and the increase in the switching loss can be suppressed.

Further, according to the semiconductor device and the power conversion device of the first embodiment, since the surge voltage measuring unit 100 and the first measuring unit 101 are provided, and the measurement result can be fed back to the resistance value of the first variable resistor 60, such that precise alignment at the design stage of the semiconductor device or the power conversion device becomes unnecessary. Therefore, the number of circuit design processes can be decreased.

As described above, according to the semiconductor device and the power conversion device of the first embodiment, the increase in the switching loss can be suppressed, and the low-loss semiconductor device and power conversion device can be achieved. In addition, the number of processes of the circuit design of the semiconductor device and the power conversion device can be decreased.

Second Embodiment

A semiconductor device and a power conversion device according to a second embodiment are different from those of the first embodiment in that a gate signal generating circuit generating a gate signal to be applied to a gate electrode is further included and a controller controls the gate signal generating circuit based on a measurement result of a first measuring unit to change a carrier frequency of the gate signal. Hereinafter, a part of the description that overlaps the first embodiment will not be described.

Figure 3:
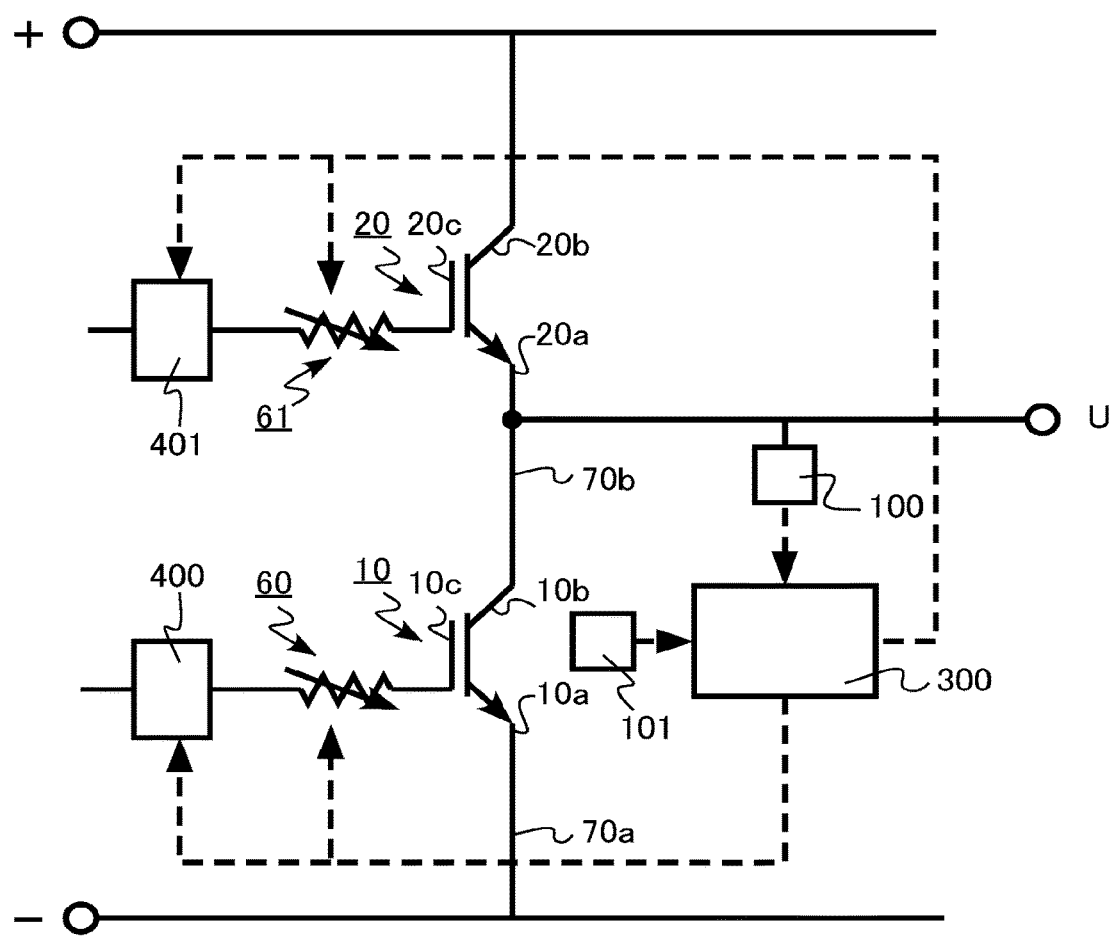
FIG. 3 is a schematic diagram of a semiconductor device according to a second embodiment.

FIG. 3 is a schematic diagram of the semiconductor device of the second embodiment. The power conversion device of the second embodiment is an inverter circuit using the semiconductor device of FIG. 3.

The semiconductor device of the second embodiment includes a low side transistor 10 (transistor), a high side transistor 20, a surge voltage measuring unit 100, a first measuring unit 101, a controller 300, a first variable resistor 60, a second variable resistor 61, a wiring 70a, a wiring 70b, a first gate signal generating circuit 400, and a second gate signal generating circuit 401.

The first gate signal generating circuit 400 is electrically connected to a gate electrode 10c and the first variable resistor 60. The first gate signal generating circuit 400 generates a gate signal to be applied to the gate electrode 10c. The first gate signal generating circuit 400 has a function of changing the carrier frequency of the gate signal.

The first gate signal generating circuit 400 is, for example, an electronic circuit. The first gate signal generating circuit 400 is, for example, an IC in which a plurality of elements are integrated into one chip or an electronic circuit board on which a plurality of electronic components are disposed. A configuration of the first gate signal generating circuit 400 is not limited as long as the first gate signal generating circuit 400 can generate the gate signal. For example, a microcomputer of the controller 300 may include the function of the first gate signal generating circuit 400.

The second gate signal generating circuit 401 is electrically connected to a gate electrode 20c and the second variable resistor 61. The second gate signal generating circuit 401 generates the gate signal to be applied to the gate electrode 20c. The second gate signal generating circuit 401 has a function of changing a carrier frequency of the gate signal.

The second gate signal generating circuit 401 is, for example, an electronic circuit. The second gate signal generating circuit 401 is, for example, an IC in which a plurality of elements are integrated into one chip or an electronic circuit board on which a plurality of electronic components are disposed. A configuration of the second gate signal generating circuit 401 is not limited as long as the second gate signal generating circuit 401 can generate the gate signal. For example, the microcomputer of the controller 300 may include the function of the second gate signal generating circuit 401.

The controller 300 has a function of controlling the first gate signal generating circuit 400 and the second gate signal generating circuit 401 based on the measurement result of the first measuring unit 101. The controller 300 has a function of changing the carrier frequency of the gate signal generated by the first gate signal generating circuit 400 and the second gate signal generating circuit 401. For simplicity of explanation, the control of the first gate signal generating circuit 400 will be described below by way of example.

The controller 300 feeds back the measurement result of the first measuring unit 101 to the carrier frequency of the gate signal of the first gate signal generating circuit 400. For example, when the electromagnetic noise measured by the first measuring unit 101 exceeds the target value, the controller 300 periodically changes the carrier frequency of the gate signal of the first gate signal generating circuit 400 within a predetermined width. By periodically changing the carrier frequency of the gate signal in the predetermined width, the electromagnetic noise is averaged and a peak value of the electromagnetic noise is reduced.

According to the semiconductor device and the power conversion device of the second embodiment, the measurement result of the surge voltage measuring unit 100 is fed back to the resistance value of the first variable resistor 60. Therefore, the generation of the surge voltage is suppressed. In addition, the measurement result of the first measuring unit 101 is fed back to the carrier frequency of the gate signal of the first gate signal generating circuit 400. Therefore, the occurrence of the electromagnetic noise is suppressed.

For example, it is assumed that a second lower limit value of the resistance value of the first variable resistor 60 calculated from the electromagnetic noise measured by the first measuring unit 101 is much larger than a first lower limit value of the resistance value of the first variable resistor 60 calculated from the surge voltage measured by the surge voltage measuring unit 100. In this case, for example, the resistance value of the first variable resistor 60 is set to be equal to or lower than the second lower limit value from the viewpoint of the suppression of the electromagnetic noise. By doing so, the switching speed may be greatly decreased, and the switching loss may be extremely increased.

According to the semiconductor device and the power conversion device of the second embodiment, the occurrence of the electromagnetic noise can be suppressed without increasing the resistance value of the first variable resistor 60. Therefore, the decrease in the switching speed is suppressed, and the switching loss is suppressed.

As described above, according to the semiconductor device and the power conversion device of the second embodiment, the increase in the switching loss can be suppressed, and the low-loss semiconductor device and power conversion device can be achieved. In addition, like the first embodiment, the number of processes of the circuit design of the semiconductor device and the power conversion device can be decreased.

Third Embodiment

A semiconductor device and a power conversion device of a third embodiment are different from those of the second embodiment in that a controller controls a gate signal generating circuit based on a measurement result of a first measuring unit, controls a variable resistor in synchronization with the gate signal generating circuit, and changes a resistance value of the variable resistor in units of pulse of the gate signal. Hereinafter, a part of the description duplicated with the first or second embodiment will not be described.

Figure 4:
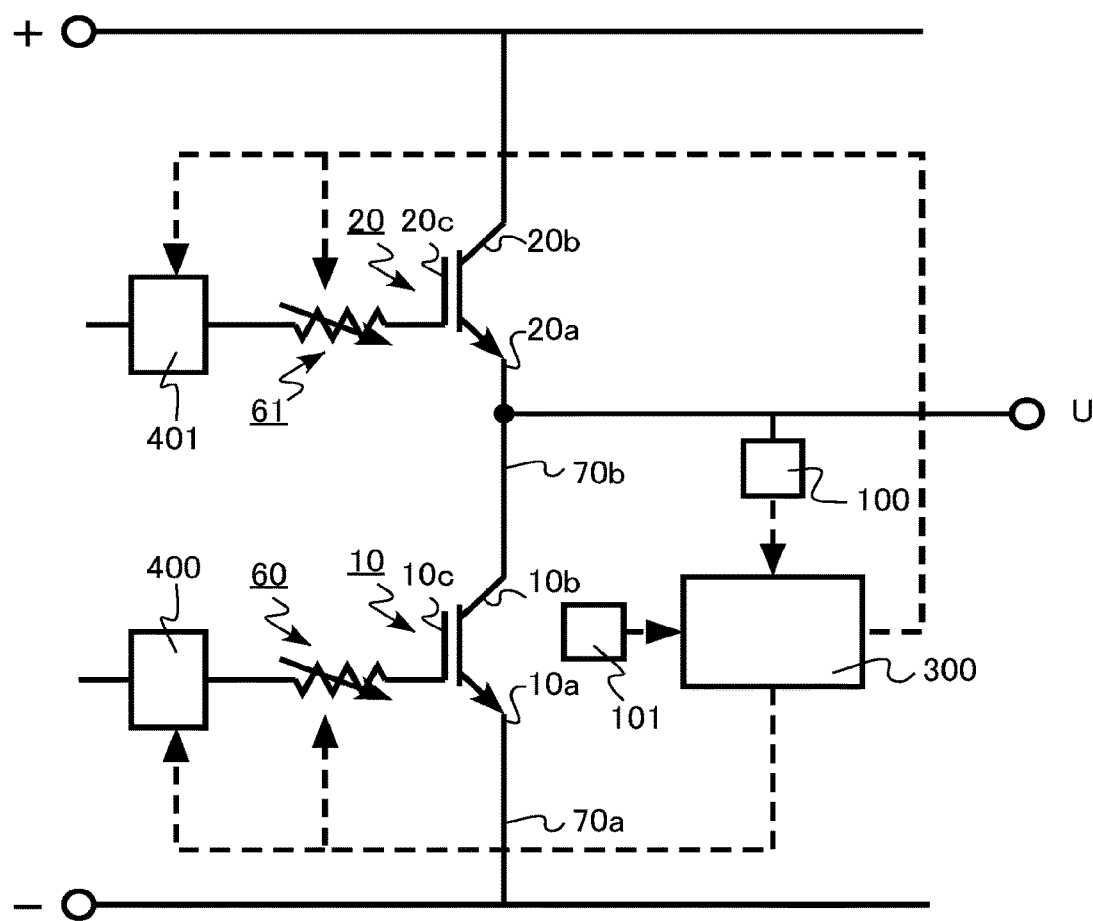
FIG. 4 is a schematic diagram of a semiconductor device according to a third embodiment.

FIG. 4 is a schematic diagram of a semiconductor device of the third embodiment. The power conversion device of the third embodiment is an inverter circuit using the semiconductor device of FIG. 4. The semiconductor device of the third embodiment is the same as the second embodiment except for the function of a controller 300.

The controller 300 has a function of controlling a first gate signal generating circuit 400 and a second gate signal generating circuit 401 based on the measurement result of a first measuring unit 101. The controller 300 has a function of synchronizing the first gate signal generating circuit 400 with the second gate signal generating circuit 401 to control a first variable resistor 60 and a second variable resistor 61. The controller 300 has a function of changing resistance values of the first variable resistor 60 and the second variable resistor 61 in units of pulse of the gate signal. For simplicity of explanation, the control of the first gate signal generating circuit 400 and the first variable resistor 60 will be described below by way of example.

The controller 300 feeds back the measurement result of the first measuring unit 101 to the first variable resistor 60. At the time of feedback, the change in the first variable resistor 60 is synchronized with the operation of the first gate signal generating circuit 400. That is, the resistance value of the first variable resistor 60 is changed in units of pulse of the gate signal generated by the first gate signal generating circuit 400.

Figure 5A:
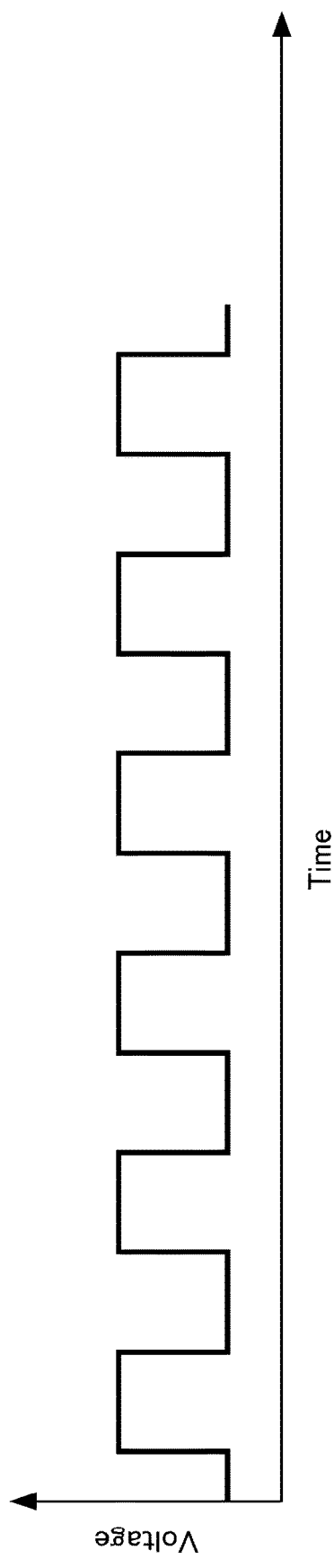
FIGS. 5A and 5B are explanatory diagrams of an operation of the semiconductor device according to the third embodiment.
Figure 5B:
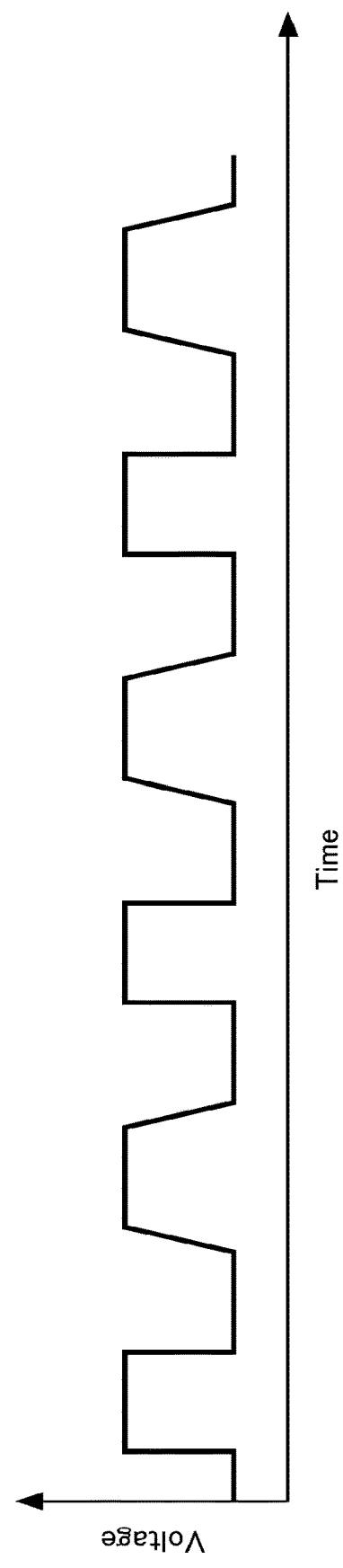

FIGS. 5A and 5B are explanatory diagrams of the operation of the semiconductor device according to the third embodiment. FIGS. 5A and 5B show pulses of the gate signal applied to a gate electrode 10c of a low side transistor 10. FIG. 5A shows a case in which the control of the first variable resistor 60 is not performed, and FIG. 5B shows a case in which the control of the first variable resistor 60 of the third embodiment is performed.

In the case of FIG. 5A, the resistance value of the first variable resistor 60 is constant for each pulse. Therefore, the pulse is maintained in a predetermined shape.

On the other hand, in the case of FIG. 5B, a control is performed to increase the resistance value of the first variable resistor 60 every other pulse. For this reason, the shape of the pulse is changed every other pulse. The rise and fall of the pulse become gentle every other pulse. Therefore, the peak value of the generated electromagnetic noise is decreased. The peak value of the electromagnetic noise appears as a time average of the electromagnetic noise occurring by each pulse.

The change in the resistance value of the first variable resistor 60 does not necessarily have to be performed every other pulse. The proportion of the pulse for changing the resistance is arbitrary.

According to the semiconductor device and the power conversion device of the third embodiment, the measurement result of the surge voltage measuring unit 100 is fed back to the resistance value of the first variable resistor 60. Therefore, the generation of the surge voltage is suppressed. In addition, the measurement result of the first measuring unit 101 is fed back to change the resistance value of the first variable resistor 60 in units of pulse of the gate signal. Therefore, the occurrence of the electromagnetic noise is suppressed.

For example, when the resistance value of the first variable resistor 60 is increased from the viewpoint of the suppression of the electromagnetic noise, the switching speed may be decreased and the switching loss may be increased. By changing the resistance value of the first variable resistor 60 in units of pulses of the gate signal, the decrease in the switching speed is suppressed and the switching loss is suppressed.

As described above, according to the semiconductor device and the power conversion device of the third embodiment, the increase in the switching loss can be suppressed, and the low-loss semiconductor device and power conversion device can be achieved. In addition, like the first embodiment, the number of processes of the circuit design of the semiconductor device and the power conversion device can be decreased.

Fourth Embodiment

A semiconductor device and a power conversion device of a fourth embodiment are different from those of the first embodiment in that a second measuring unit is provided instead of the first measuring unit. Hereinafter, a part of the description that overlaps the first embodiment will not be described.

Figure 6:
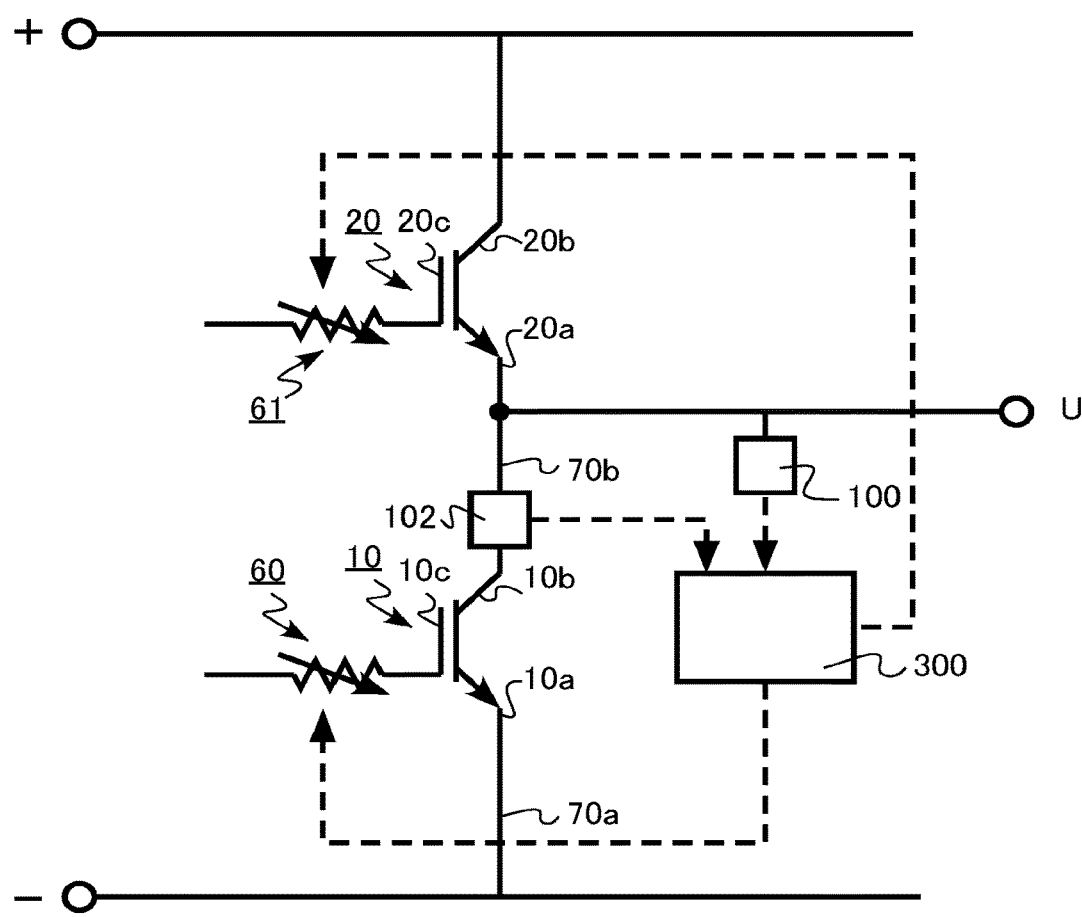
FIG. 6 is a schematic diagram of a semiconductor device according to a fourth embodiment.

FIG. 6 is a schematic diagram of the semiconductor device of the fourth embodiment. The power conversion device of the fourth embodiment is an inverter circuit using the semiconductor device of FIG. 6.

The semiconductor device of the fourth embodiment includes a low side transistor 10 (semiconductor element), a high side transistor 20, a surge voltage measuring unit 100, a second measuring unit 102, a controller 300, a first variable resistor 60, a second variable resistor 61, a wiring 70a, and a wiring 70b.

The second measuring unit 102 has a function of measuring a voltage of the wiring 70b electrically connected to a collector electrode 10b. The second measuring unit 102 is, for example, a voltmeter. The configuration of the second measuring unit 102 is not limited as long as the second measuring unit 102 can measure a voltage generated in the wiring 70b.

The controller 300 has a function of predicting the electromagnetic noise generated in the wiring 70b based on the measurement result of the second measuring unit 102. The controller 300 has a function of predicting the magnitude of the electromagnetic noise occurring in the wiring 70b from a change (dV/dt) in voltage generated in the wiring 70b. When the change in voltage is large, the occurring electromagnetic noise is also increased.

The controller 300 has a function of controlling a first variable resistor 60 and a second variable resistor 61 based on the measurement result of the second measuring unit 102. The controller 300 has a function of changing the resistance values of the first variable resistor 60 and the second variable resistor 61. For simplicity of explanation, the control of the first variable resistor 60 will be described below by way of example.

The controller 300 feeds back the measurement result of the second measuring unit 102 to a resistance value of the first variable resistor 60. For example, when the electromagnetic noise predicted based on the change in voltage measured by the second measuring unit 102 exceeds the target value, the controller 300 controls the first variable resistor 60 to increase the resistance value of the first variable resistor 60.

By increasing the resistance value of the first variable resistor 60, the gate resistance of the low side transistor 10 is increased, the switching speed is decreased, and the generation of the electromagnetic noise is suppressed. In other words, the change in voltage occurring in the wiring 70b is decreased, and the occurrence of the electromagnetic noise is suppressed.

According to the semiconductor device and the power conversion device of the fourth embodiment, the measurement result of the surge voltage measuring unit 100 is fed back to the resistance value of the first variable resistor 60. Therefore, the generation of the surge voltage is suppressed. In addition, the measurement result of the second measuring unit 102 is fed back to the resistance value of the first variable resistor 60. Therefore, the occurrence of the electromagnetic noise is suppressed.

As described above, according to the semiconductor device and the power conversion device of the fourth embodiment, the increase in the switching loss can be suppressed, and the low-loss semiconductor device and power conversion device can be achieved. In addition, like the first embodiment, the number of processes of the circuit design of the semiconductor device and the power conversion device can be decreased.

Fifth Embodiment

A semiconductor device and a power conversion device of a fifth embodiment are different from those of the first embodiment in that a third measuring unit is provided instead of the first measuring unit. Hereinafter, a part of the description that overlaps the first embodiment will not be described.

Figure 7:
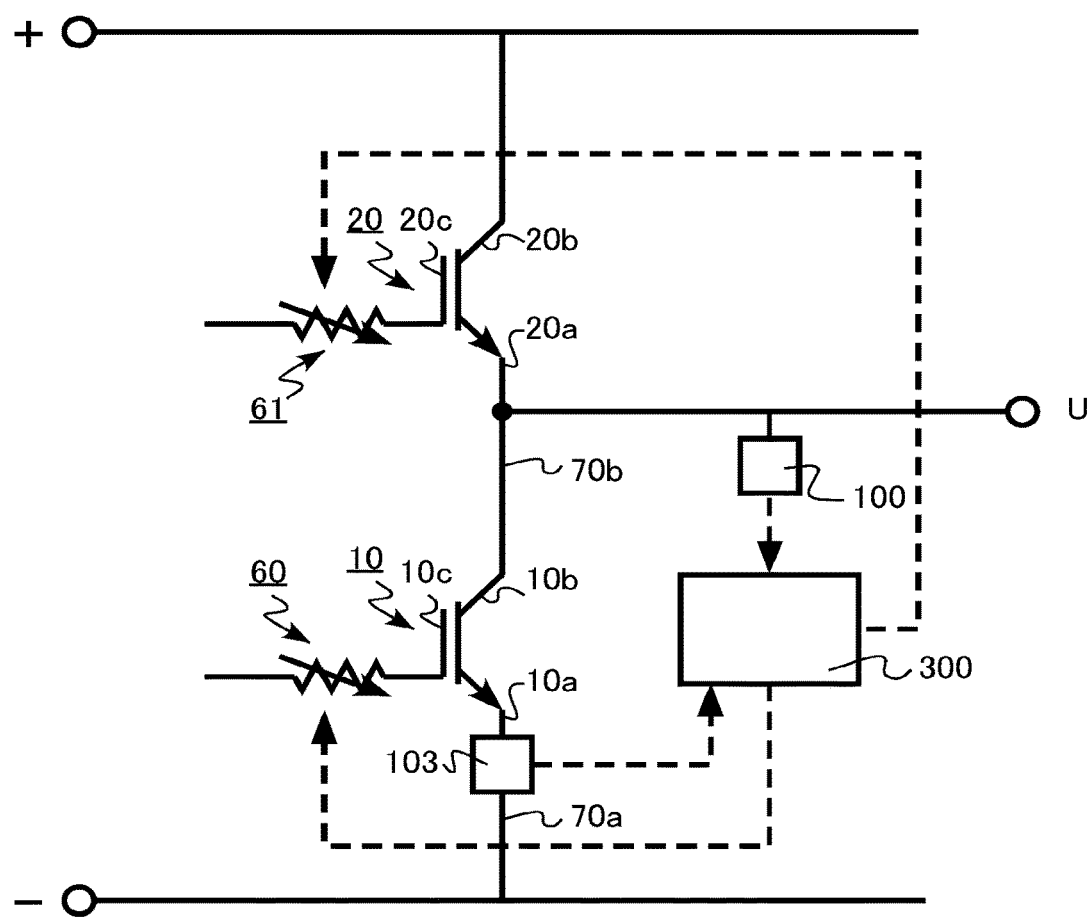
FIG. 7 is a schematic diagram of a semiconductor device according to a fifth embodiment.

FIG. 7 is a schematic diagram of the semiconductor device of the fifth embodiment. The power conversion device of the fifth embodiment is an inverter circuit using the semiconductor device of FIG. 7.

The semiconductor device of the fifth embodiment includes a low side transistor 10 (semiconductor element), a high side transistor 20, a surge voltage measuring unit 100, a third measuring unit 103, a controller 300, a first variable resistor 60, a second variable resistor 61, a wiring 70a, and a wiring 70b.

The third measuring unit 103 has a function of measuring a current flowing in the wiring 70a electrically connected to an emitter electrode 10a. The third measuring unit 103 is, for example, an ampere meter. The configuration of the third measuring unit 103 is not limited as long as the third measuring unit 103 measures a current generated in the wiring 70a.

The controller 300 has a function of controlling the first variable resistor 60 and the second variable resistor 61 based on the measurement result of the surge voltage measuring unit 100 and the measurement result of the third measuring unit 103. The controller 300 has a function of calculating an inductance of a circuit based on the measurement result of the surge voltage measuring unit 100 and the measurement result of the third measuring unit 103. In addition, the controller 300 has a function of predicting the surge voltage generated between the low side transistor 10 and the high side transistor 20 based on the calculated inductance. The controller 300 has a function of controlling the first variable resistor 60 and the second variable resistor 61 based on the predicted surge voltage.

For simplicity of explanation, the control of the first variable resistor 60 will be described below by way of example.

The surge voltage is a product of the inductance and the change in current. The inductance of the circuit can be calculated from the surge voltage measured by the surge voltage measuring unit 100 and the change (di/dt) in current measured by the third measuring unit 103.

If the magnitude of the inductance of the circuit can be estimated, it is possible to predict the surge voltage to be generated. That is, even when a state change such as the increase in the change in current and the increase in the inductance occurs, it is possible to predict the surge voltage to be generated.

The controller 300 feeds back the measurement result of the third measuring unit 103 to a resistance value of the first variable resistor 60. For example, the controller 300 controls the first variable resistor 60 in consideration of the information on the surge voltage predicted based on the change in voltage measured by the third measuring unit 103 to change the resistance value of the first variable resistor 60. Therefore, the feedback to the gate resistance with high accuracy becomes possible. Therefore, the generation of the surge voltage can be suppressed, and the switching loss can be decreased.

According to the semiconductor device and the power conversion device of the fifth embodiment, the measurement result of the surge voltage measuring unit 100 is fed back to the resistance value of the first variable resistor 60. Therefore, the generation of the surge voltage is suppressed. Further, the first variable resistor 60 is controlled in consideration of the surge voltage predicted based on the measurement result of the surge voltage measuring unit 100 and the measurement result of the first measuring unit 101.

As described above, according to the semiconductor device and the power conversion device of the fifth embodiment, the increase in the switching loss can be suppressed, and the low-loss semiconductor device and power conversion device can be achieved. In addition, like the first embodiment, the number of processes of the circuit design of the semiconductor device and the power conversion device can be decreased.

Sixth Embodiment

A semiconductor device and a power conversion device of a sixth embodiment are different from those of the second embodiment in that all of a first measuring unit, a second measuring unit, and a third measuring unit are provided. Hereinafter, a part of the description that overlaps the first to fifth embodiments will not be described.

Figure 8:
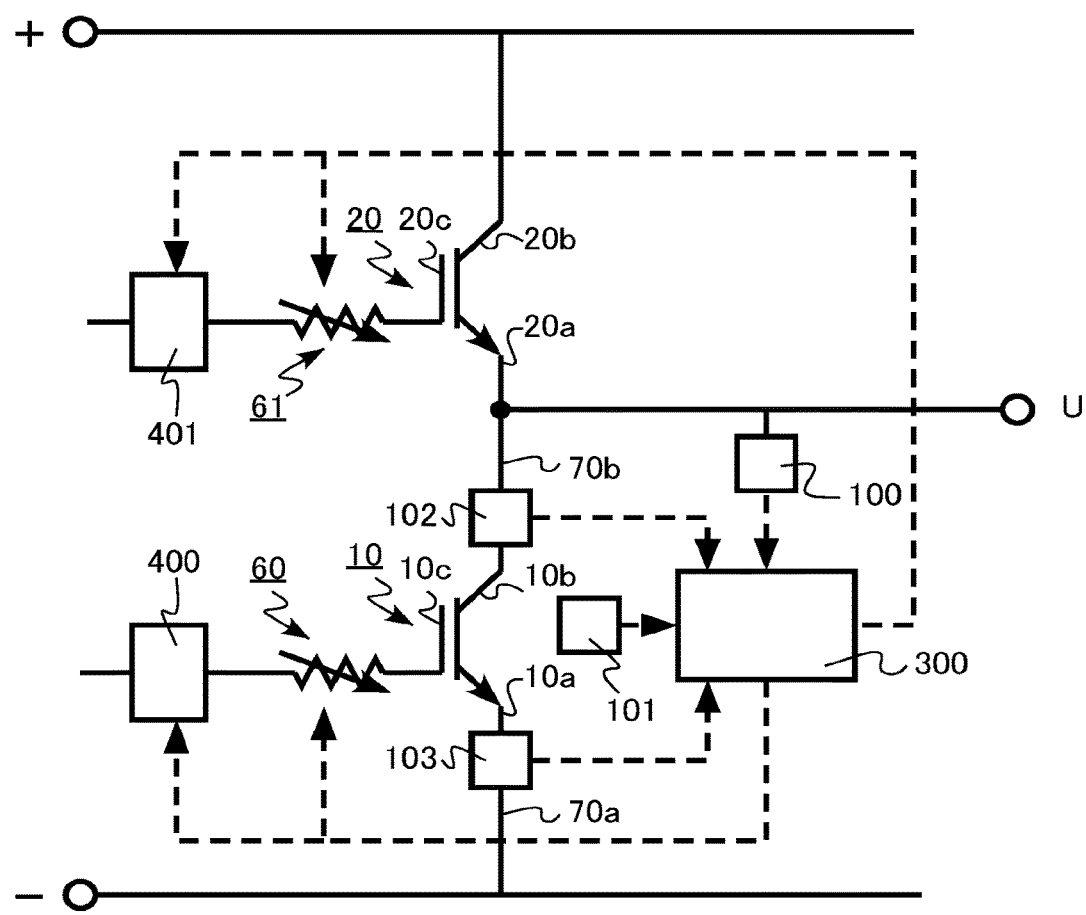
FIG. 8 is a schematic diagram of a semiconductor device according to a sixth embodiment.

FIG. 8 is a schematic diagram of the semiconductor device of the sixth embodiment. The power conversion device of the sixth embodiment is an inverter circuit using the semiconductor device of FIG. 8.

The semiconductor device of the sixth embodiment includes a low side transistor 10 (semiconductor element), a high side transistor 20, a surge voltage measuring unit 100, a first measuring unit 101, a second measuring unit 102, a third measuring unit 103, a controller 300, a first variable resistor 60, a second variable resistor 61, a wiring 70a, a wiring 70b, a first gate signal generating circuit 400, and a second gate signal generating circuit 401.

The first measuring unit 101 has a function of measuring electromagnetic noise caused by the operation of the transistor. The first measuring unit 101 is, for example, an electromagnetic noise sensor.

The second measuring unit 102 has a function of measuring a voltage of the wiring 70b electrically connected to a collector electrode 10b. The second measuring unit 102 is a voltmeter.

The third measuring unit 103 has a function of measuring a current flowing in the wiring 70a electrically connected to an emitter electrode 10a. The third measuring unit 103 is an ampere meter.

The controller 300 has a function of controlling the first variable resistor 60 and the second variable resistor 61 based on the measurement result of the surge voltage measuring unit 100. The controller 300 has a function of changing the resistance values of the first variable resistor 60 and the second variable resistor 61 to control the generation of the surge voltage.

The controller 300 has a function of controlling the first variable resistor 60 and the second variable resistor 61, for example, based on the measurement results of the first measuring unit 101 and the second measuring unit 102. The controller 300 has a function of changing the resistance values of the first variable resistor 60 and the second variable resistor 61 to suppress the occurrence of the electromagnetic noise.

In addition, the controller 300 has a function of controlling the first gate signal generating circuit 400 and the second gate signal generating circuit 401, for example, based on the measurement results of the first measuring unit 101 and the second measuring unit 102. The controller 300 changes the carrier frequency of the gate signal to suppress the occurrence of electromagnetic noise.

In addition, the controller 300 has a function of synchronizing the first gate signal generating circuit 400 with the second gate signal generating circuit 401, for example, based on the measurement results of the first measuring unit 101 and the second measuring unit 102 to control the first variable resistor 60 and the second variable resistor 61. The controller 300 has a function of changing the resistance values of the first variable resistor 60 and the second variable resistor 61 in units of pulse of the gate signal to suppress the occurrence of the electromagnetic noise.

The controller 300 has a function of predicting the surge voltage generated between the low side transistor 10 and the high side transistor 20 based on the measurement result of the third measuring unit 103. The controller 300 predicts the surge voltage generated between the low side transistor 10 and the high side transistor 20 based on the change in current occurring in the wiring 70a.

The controller 300 has a function of controlling the first variable resistor 60 and the second variable resistor 61 based on the prediction of the surge voltage obtained from the measurement result of the surge voltage measuring unit 100 and the measurement result of the third measuring unit 103. The controller 300 has a function of changing the resistance values of the first variable resistor 60 and the second variable resistor 61 to suppress the generation of the surge voltage.

According to the semiconductor device and the power conversion device of the sixth embodiment, by providing all of the first measuring unit 101, the second measuring unit 102, and the third measuring unit 103, the degree of freedom of the setting of the resistance values of the first variable resistor 60 and the second variable resistor 61 is increased. Therefore, an optimum solution of the switching speed can be easily obtained. Therefore, it is possible to achieve the low-loss semiconductor device and power conversion device.

As described above, according to the semiconductor device and the power conversion device of the sixth embodiment, the increase in the switching loss can be suppressed, and the low-loss semiconductor device and power conversion device can be achieved. In addition, like the first embodiment, the number of processes of the circuit design of the semiconductor device and the power conversion device can be decreased.

Seventh Embodiment

A semiconductor device and a power conversion device of a seventh embodiment are different from those of the first to sixth embodiments in that a detailed circuit configuration of the surge voltage measuring unit 100 is shown. Hereinafter, a part of the description that overlaps the first to sixth embodiments will not be described.

Figure 9:
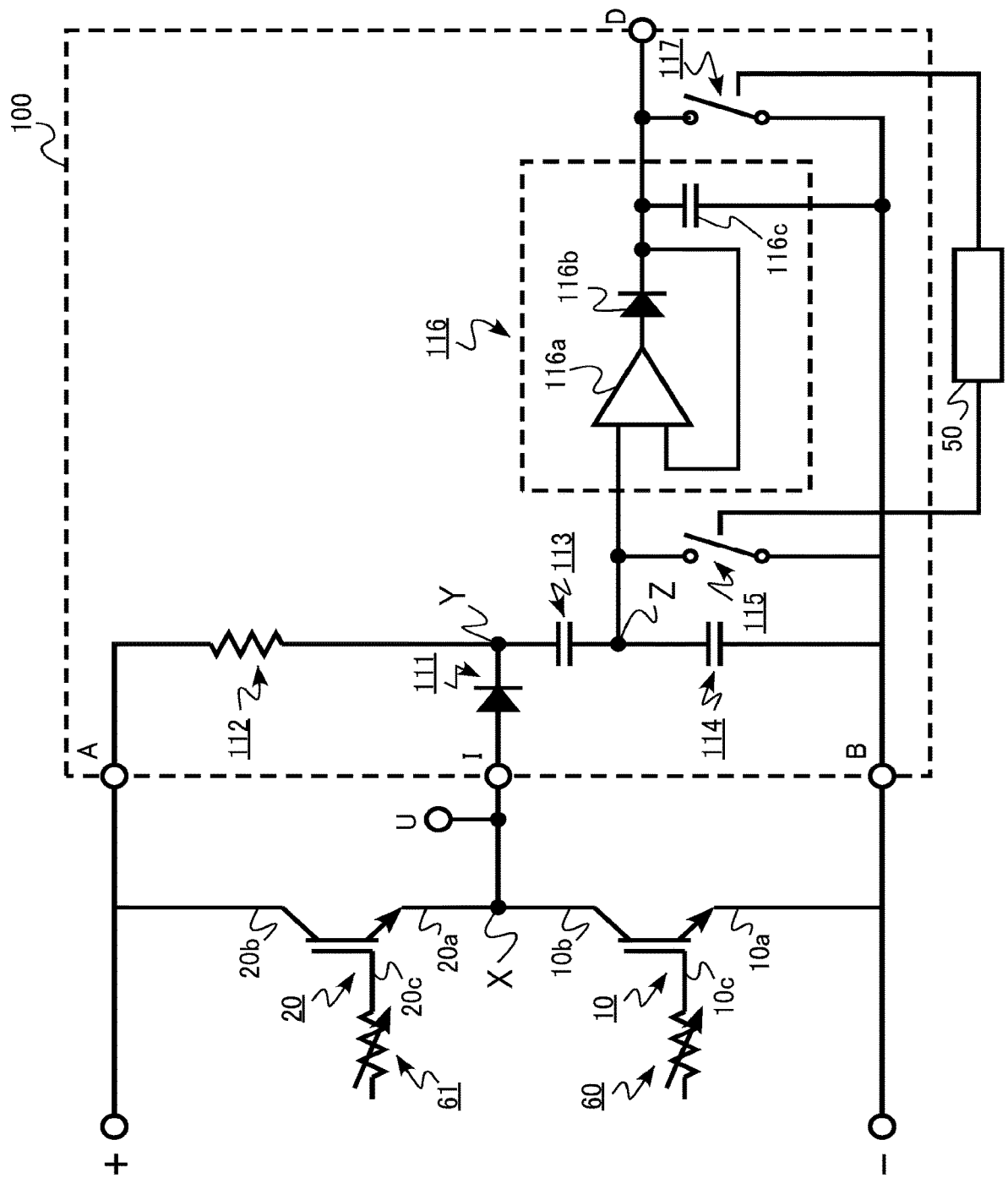
FIG. 9 is a circuit diagram of a surge voltage measuring unit according to a seventh embodiment.

FIG. 9 is a circuit diagram of a surge voltage measuring unit 100 according to the seventh embodiment.

The surge voltage measuring unit 100 includes a diode 111, an electric resistor 112, a capacitor 113, a capacitor 114, a switching element 115, a sample and hold circuit 116, a switching element 117, an input terminal A, an input terminal B, an input terminal I, and a detection terminal D.

The sample and hold circuit 116 includes an operational amplifier 116a, a diode 116b, and a capacitor 116c.

The input terminal A of the surge voltage measuring unit 100 is electrically connected to a positive electrode of a DC power supply. The input terminal B of the surge voltage measuring unit 100 is electrically connected to a negative electrode of the DC power supply.

The input terminal I of the surge voltage measuring unit 100 is electrically connected to a collector electrode 10b of a low side transistor 10 and an emitter electrode 20a of a high side transistor 20.

The detection result of the surge voltage is output from the detection terminal D of the surge voltage measuring unit 100.

An on-off operation of the switching element 115 and the switching element 117 is controlled, for example, by a switching controller 50.

According to the surge voltage measuring unit 100 of the seventh embodiment, a peak value of the surge voltage is maintained for a certain period of time by a rectification action of the diode 111, and the peak value of the surge voltage can be detected by being decreased by capacitance division of the capacitor 113 and the capacitor 114. Therefore, it is possible to achieve a surge voltage detection circuit which directly detects the peak value of the surge voltage, which is a high voltage and a short time, generated in the power transistor.

As described above, according to the semiconductor device and the power conversion device of the seventh embodiment, the increase in the switching loss can be suppressed, and the low-loss semiconductor device and power conversion device can be achieved. In addition, like the first embodiment, the number of processes of the circuit design of the semiconductor device and the power conversion device can be decreased.

Eighth Embodiment

A semiconductor device and a power conversion device of an eighth embodiment are different from those of the first to sixth embodiments in that a detailed circuit configuration of a surge voltage measuring unit 100 is shown. Hereinafter, a part of the description which overlaps the first to sixth embodiments will not be described.

Figure 10:
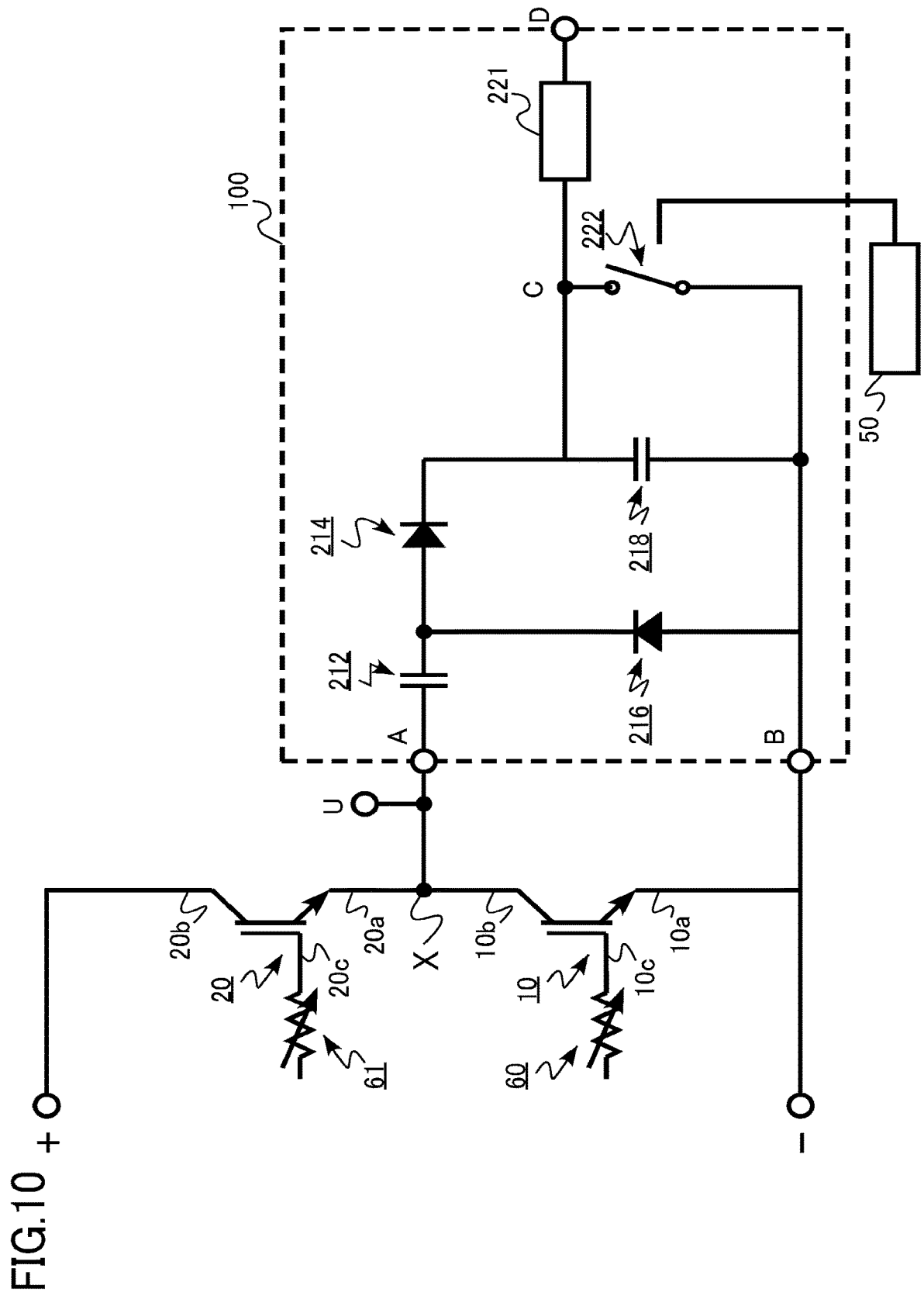
FIG. 10 is a circuit diagram of a surge voltage measuring unit according to an eighth embodiment.

FIG. 10 is a circuit diagram of the surge voltage measuring unit 100 according to the eighth embodiment.

The surge voltage measuring unit 100 includes a first capacitor 212, a first diode 214, a second diode 216, a second capacitor 218, a sample and hold circuit 221, a switch 222, an input terminal A, an input terminal B, and a detection terminal D.

The input terminal A of the surge voltage measuring unit 100 is electrically connected to a collector electrode 10b of a low side transistor 10 and an emitter electrode 20a of a high side transistor 20. The input terminal B of the surge voltage measuring unit 100 is electrically connected to a negative electrode of the DC power supply.

The detection result of the surge voltage is output from the detection terminal D of the surge voltage measuring unit 100.

An on-off operation of the switch 222 is controlled, for example, by a switching controller 50.

According to the surge voltage measuring unit 100 of the eighth embodiment, a displacement current flows by the first capacitor 212 and an electric charge is accumulated by the second capacitor 218. Then, a voltage increased by the accumulation of the electric charge is detected by the sample and hold circuit 221. A discharge of the electric charge accumulated in the second capacitor 218 is suppressed by the first diode 214. When the surge disappears, a current flows from the first capacitor 212 toward the input terminal A. The flow of the current is guaranteed by the second diode 216. Therefore, it is possible to achieve a surge voltage detection circuit which directly detects the peak value of the surge voltage, which is a high voltage and a short time, generated in the power transistor.

As described above, according to the semiconductor device and the power conversion device of the eighth embodiment, the increase in the switching loss can be suppressed, and the low-loss semiconductor device and power conversion device can be achieved. In addition, like the first embodiment, the number of processes of the circuit design of the semiconductor device and the power conversion device can be decreased.

Ninth Embodiment

A driving device of the ninth embodiment is the driving device including the power conversion device of the first embodiment.

Figure 11:
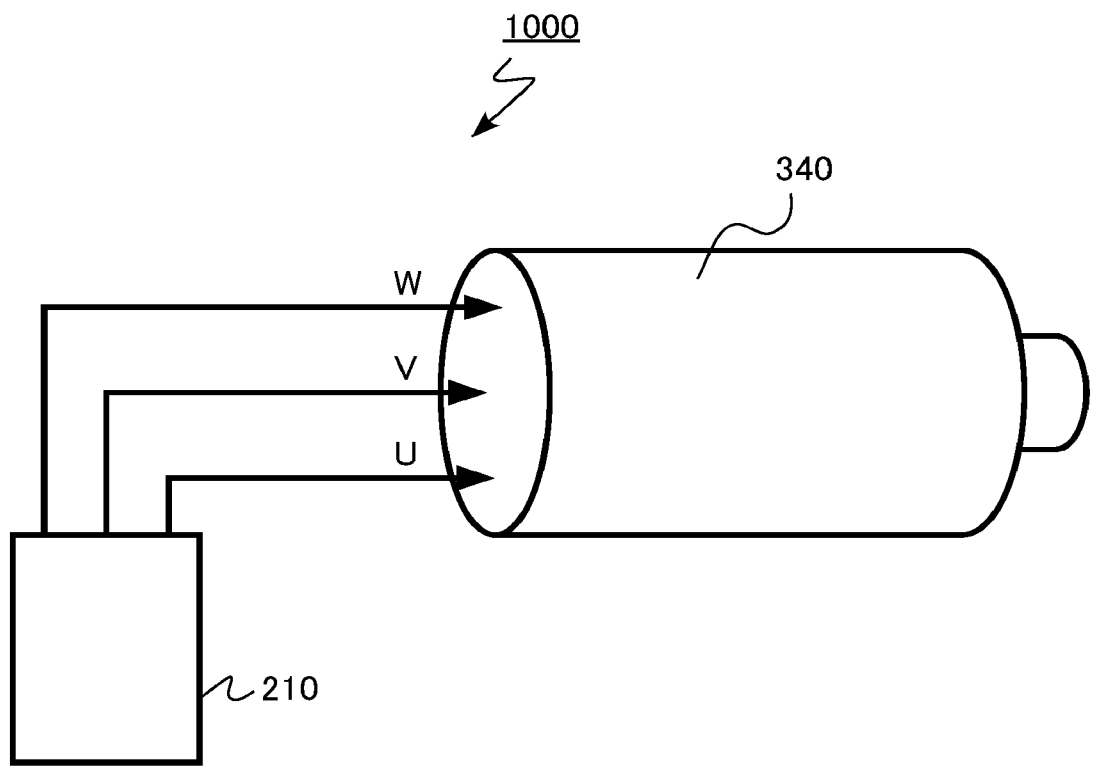
FIG. 11 is a schematic diagram of a driving device according to a ninth embodiment.

FIG. 11 is a schematic diagram of the driving device according to the ninth embodiment. A driving device 1000 includes a motor 340 and an inverter circuit 210. An AC voltage output from the inverter circuit 210 drives the motor 340.

According to the ninth embodiment, the characteristics of the driving device 1000 are improved by providing the low-loss inverter circuit 210.

Tenth Embodiment

A vehicle of the tenth embodiment is the vehicle including the power conversion device of the first embodiment.

Figure 12:
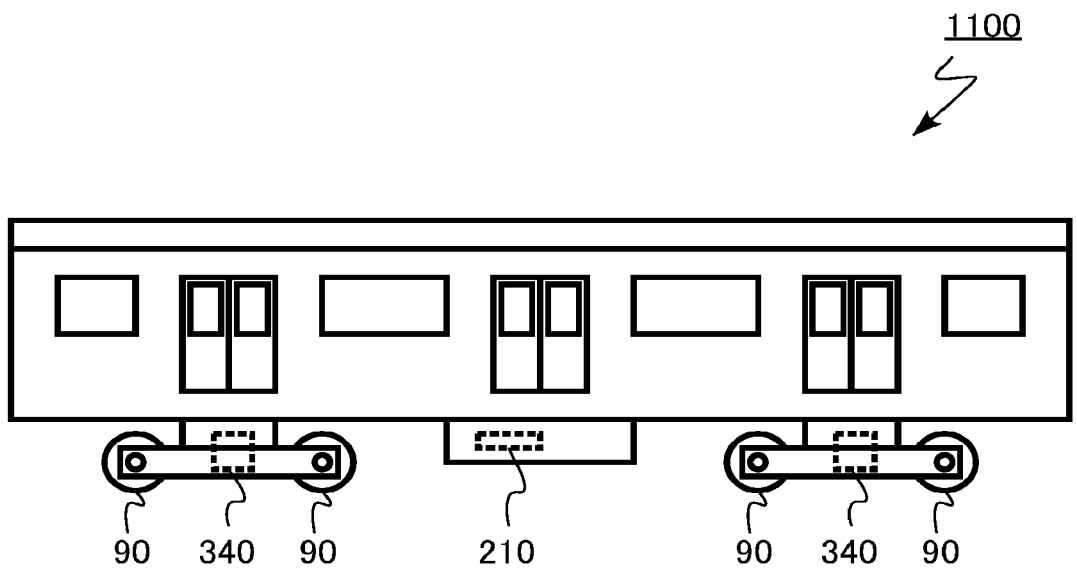
FIG. 12 is a schematic diagram of a vehicle according to a tenth embodiment.

FIG. 12 is a schematic diagram of the vehicle according to the tenth embodiment. A vehicle 1100 of the tenth embodiment is a railway vehicle. The vehicle 1100 includes a motor 340 and an inverter circuit 210.

An AC voltage output from the inverter circuit 210 drives the motor 340. Wheels 90 of the vehicle 1100 are rotated by the motor 340.

According to the tenth embodiment, the characteristics of the vehicle 1100 are improved by providing the low-loss inverter circuit 210.

Eleventh Embodiment

A vehicle of the eleventh embodiment is the vehicle including the power conversion device of the first embodiment.

Figure 13:
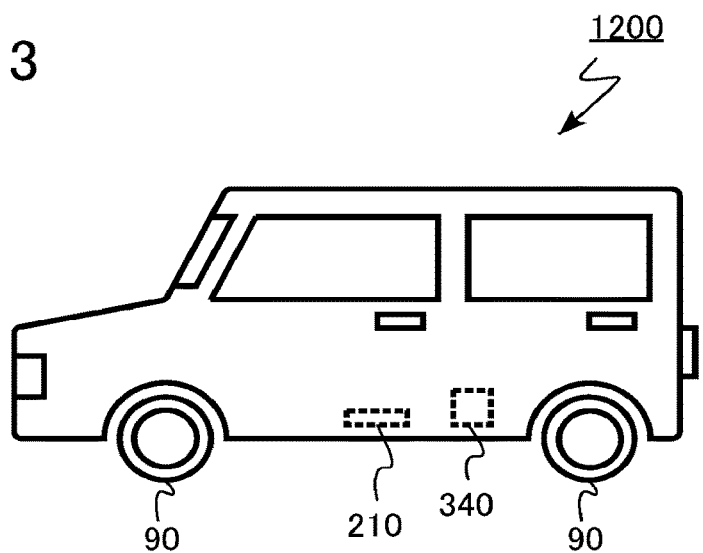
FIG. 13 is a schematic diagram of a vehicle according to an eleventh embodiment.

FIG. 13 is a schematic diagram of the vehicle according to the eleventh embodiment. A vehicle 1200 of the eleventh embodiment is an automobile. The vehicle 1200 includes a motor 340 and an inverter circuit 210.

An AC voltage output from the inverter circuit 210 drives the motor 340. Wheels 90 of the vehicle 1200 are rotated by the motor 340.

According to the eleventh embodiment, the characteristics of the vehicle 1200 are improved by providing the low-loss inverter circuit 210.

Twelfth Embodiment

An elevator of a twelfth embodiment is the elevator including the power conversion device of the first embodiment.

Figure 14:
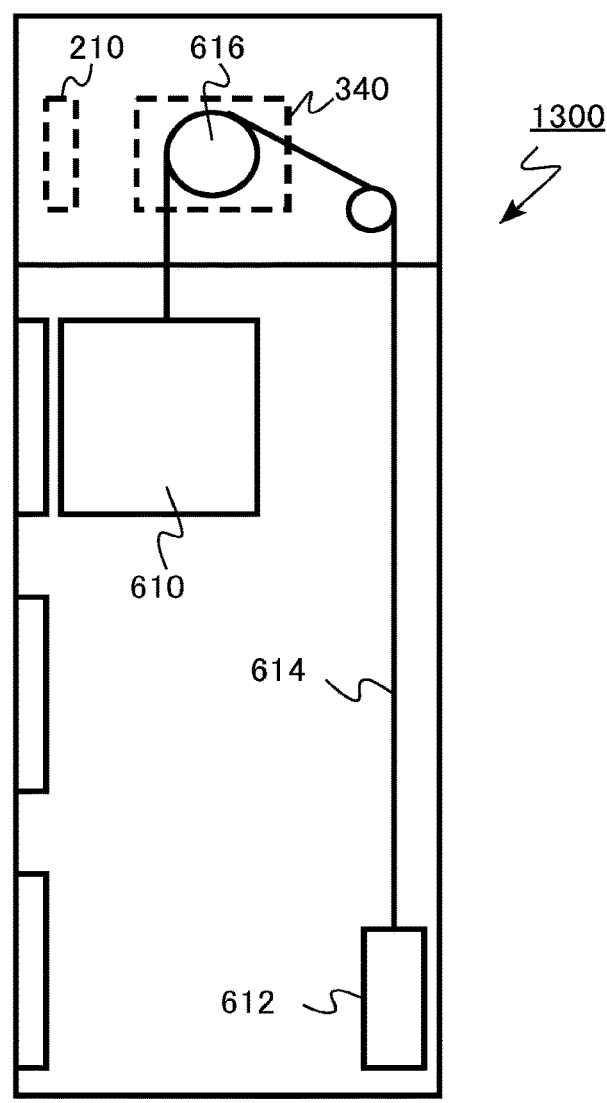
FIG. 14 is a schematic diagram of an elevator according to a twelfth embodiment.

FIG. 14 is a schematic diagram of the elevator according to the twelfth embodiment. An elevator 1300 of the twelfth embodiment includes a car 610, a counterweight 612, a wire rope 614, a winding machine 616, a motor 340, and an inverter circuit 210.

An AC voltage output from the inverter circuit 210 drives the motor 340. The winding machine 616 is rotated by the motor 340, and the car 610 moves up and down.

According to the twelfth embodiment, the characteristics of the elevator 1300 are improved by providing the low-loss inverter circuit 210.

In the first to eighth embodiments, the case in which the controller 300 controls both of the first variable resistor 60 and the second variable resistor 61, or both of the first gate signal generating circuit 400 and the second gate signal generating circuit 401 was described by way of example. However, the controller 300 can also be configured to control any one of the first variable resistor 60 or the second variable resistor 61, or any one of the first gate signal generating circuit 400 and the second gate signal generating circuit 401.

In the first to eighth embodiments, the inverter circuit is described as an example of the power conversion device, but a DC-DC converter may be applied as an example of the power conversion device. In addition, the case of controlling the semiconductor element of the power conversion device has been described by way of example, but the present disclosure can also be applied to the case of controlling the semiconductor element to be used other than the power conversion device.

In the first to eighth embodiments, an IGBT is described as an example of the semiconductor element, but the semiconductor element is not necessarily limited to the IGBT. For example, other semiconductor elements such as a metal oxide field effect transistor (MOSFET) can be applied.

The semiconductor elements of the first to eighth embodiments include a semiconductor layer of at least one kind selected from SiC, GaN, and Si, for example. The semiconductor elements of the first to eighth embodiments are formed using SiC, GaN, or Si, for example.

In the ninth to twelfth embodiments, the case where the power conversion device of the first embodiment is applied is described by way of example, but it is also possible to apply the power conversion devices of the second to eighth embodiments.

In the ninth to twelfth embodiments, the case where the semiconductor device and the power conversion device of the present disclosure are applied to the driving device, the vehicle, or the elevator has been described by way of example, but the semiconductor device and the power conversion device of the present disclosure can also be applied to, for example, a power conditioner of a photovoltaic power generation system, and the like.

While certain embodiments have been described, these embodiments have been presented by way of example only, and are not intended to limit the scope of the inventions. Indeed, a semiconductor device, a power conversion device, a driving device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor element having a first electrode, a second electrode, and a gate electrode;
   a surge voltage measuring unit electrically connected to the first electrode or the second electrode, the surge voltage measuring unit configured to measure a surge voltage;
   at least one measuring unit selected from a first measuring unit configured to measure electromagnetic noise caused by an operation of the semiconductor element, a second measuring unit configured to measure a voltage of a wiring electrically connected to the first electrode or the second electrode, and a third measuring unit configured to measure a current of the wiring electrically connected to the first electrode or the second electrode;
   a variable resistor electrically connected to the gate electrode; and
   a controller configured to control the variable resistor based on first measurement result of the surge voltage measuring unit and second measurement result of the at least one measuring unit and change a resistance value of the variable resistor.

2. The semiconductor device according to claim 1, further comprising:
   a gate signal generating circuit configured to generate a gate signal applied to the gate electrode,
   wherein the at least one measuring unit includes at least one of the first measuring unit and the second measuring unit, and
   the controller controls the gate signal generating circuit based on the second measurement result so as to change a carrier frequency of the gate signal, and the second measurement result is a measurement result of the at least one of the first measuring unit and the second measuring unit.

3. The semiconductor device according to claim 1, further comprising:
   a gate signal generating circuit configured to generate a gate signal applied to the gate electrode,
   wherein the at least one measuring unit includes at least one of the first measuring unit and the second measuring unit, and
   the controller controls the variable resistor based on the second measurement result so as to change the resistance value of the variable resistor in units of pulse of the gate signal, and the second measurement result is a measurement result of the at least one of the first measuring unit and the second measuring unit.

4. The semiconductor device according to claim 1, wherein the controller calculates a first lower limit value of the resistance value of the variable resistor based on the first measurement result and a second lower limit value of the resistance value of the variable resistor based on the second measurement result, and compares the first lower limit value with the second lower limit value to perform a control such that the resistance value of the variable resistor becomes equal to or higher than the resistance value of a higher one of the first lower limit value and the second lower limit value.

5. The semiconductor device according to claim 1,
   wherein the at least one measuring unit includes the second measuring unit, and
   the controller is configured to predict a magnitude of electromagnetic noise based on the second measurement result and changes the resistance value of the variable resistor based on the magnitude of electromagnetic noise, the second measurement result is a measurement result of the second measuring unit.

6. The semiconductor device according to claim 1,
   wherein the at least one measuring unit includes the third measuring unit, and
   the controller calculates an inductance based on the first measurement result and the second measurement result, and changes the resistance value of the variable resistor based on the inductance, the second measurement result is a measurement result of the third measuring unit.

7. The semiconductor device according to claim 1, wherein the semiconductor element includes a semiconductor layer made of SiC, GaN, or Si.

8. The semiconductor device according to claim 1, wherein the semiconductor element is an insulated gate bipolar transistor (IGBT).

9. A power conversion device comprising the semiconductor device according to claim 1.

10. A driving device comprising the power conversion device according to claim 9.

11. A vehicle comprising the power conversion device according to claim 9.

12. An elevator comprising the power conversion device according to claim 9.

* * * * *